(12) United States Patent
Larsson et al.

(10) Patent No.: US 10,921,251 B2
(45) Date of Patent: Feb. 16, 2021

(54) CHAMBER COMPONENT PART WEAR INDICATOR AND A SYSTEM FOR DETECTING PART WEAR

(71) Applicant: Applied Materials, Inc., Santa Clara, CA (US)

(72) Inventors: Mats Larsson, Sunnyvale, CA (US); Kevin A. Papke, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 390 days.

(21) Appl. No.: 15/243,282

(22) Filed: Aug. 22, 2016

(65) Prior Publication Data

US 2018/0052104 A1     Feb. 22, 2018

(51) Int. Cl.
G01N 21/64 (2006.01)
H01J 37/32 (2006.01)
G01N 3/56 (2006.01)

(52) U.S. Cl.
CPC .............. *G01N 21/64* (2013.01); *G01N 3/56* (2013.01); *H01J 37/32082* (2013.01); *H01J 37/32458* (2013.01); *H01J 37/32467* (2013.01); *H01J 37/32477* (2013.01); *H01J 37/32697* (2013.01); *H01J 37/32715* (2013.01); *H01J 37/32935* (2013.01); *G01N 2201/06113* (2013.01); *H01J 2237/24592* (2013.01)

(58) Field of Classification Search
CPC ......... G01N 21/64; G01N 2201/06113; G01N 3/56; H01L 21/67242; H01L 21/67282; H01L 21/67288; H01J 37/32082; H01J 37/32458; H01J 37/32467; H01J 37/32477; H01J 37/32495; H01J 37/32642; H01J 37/32697; H01J 37/32715; H01J 37/32807; H01J 37/32935; H01J 37/3299; H01J 2237/24592
See application file for complete search history.

(56) References Cited

U.S. PATENT DOCUMENTS 6,077,387 A * 6/2000 Tesauro ............ H01J 37/32935
156/345.24
8,004,293 B2   8/2011 White et al.
(Continued)

FOREIGN PATENT DOCUMENTS

JP        08203865 A  *  8/1996

OTHER PUBLICATIONS

Stanton et al, Oct. 13, 2015, Application note: Lanthanide-Based Up-Conversion Materials, AN_P20 v.2.*

*Primary Examiner* — Benjamin Kendall
(74) *Attorney, Agent, or Firm* — Patterson + Sheridan, LLP

(57) ABSTRACT

The present invention generally relates method and part wear indicator for identifying an eroded chamber component in an etching or other plasma processing chamber. In one embodiment, a chamber component has a part wear indicator. The chamber component has a body. The body has a top surface and a bottom surface. A part wear indicator material is disposed in the chamber component body. The part wear indicator has a body. The body of the part wear indicator has a transparent first layer. A second layer has a tracer material disposed therein and wherein the first layer is closer to the top surface of the top surface than the second layer.

7 Claims, 4 Drawing Sheets

(56) References Cited

U.S. PATENT DOCUMENTS

| | | | |
|---|---|---|---|
| 2004/0125359 A1* | 7/2004 | Ludviksson | G01N 21/64 356/72 |
| 2004/0125360 A1* | 7/2004 | Ludviksson | G01N 21/645 356/72 |
| 2004/0241873 A1* | 12/2004 | Davis | G01N 21/6456 436/172 |
| 2005/0136486 A1* | 6/2005 | Haushalter | B82Y 5/00 435/7.2 |
| 2010/0102237 A1* | 4/2010 | Nomura | G01N 21/64 250/363.01 |
| 2013/0002167 A1* | 1/2013 | Van de Ven | H05B 33/0815 315/297 |
| 2015/0211998 A1* | 7/2015 | Kuo | G01N 21/64 356/301 |

* cited by examiner

CHAMBER COMPONENT PART WEAR INDICATOR AND A SYSTEM FOR DETECTING PART WEAR

BACKGROUND

Field

Embodiments of the present invention generally relate to a chamber component having a part wear indicator, and system and method for identifying worn chamber components in an etching or other plasma processing chamber.

Description of the Related Art

In semiconductor processing chambers, substrates undergo various processes such as deposition, etching and annealing. During some of the processes, the substrate is placed onto a substrate support such as an electrostatic chuck (ESC), for processing. In an etch process performed in an etch processing chamber, chamber components, such as an edge ring, may be placed around the substrate to prevent erosion of the areas of the substrate support that are not covered by the substrate. The edge ring focuses the plasma and positions the substrate in place.

Many chamber components used in etch and other various types of processing chambers are often attacked by aggressive agents, e.g. plasma or acids, and thereby eroded. Such chamber components may include, for example, rings, liners, ESCs, gas distribution plates, showerheads, etc. To reduce the degradation and thereby prolong the service life of chamber components, various types of coatings can be used. Due to erosion the surface of the chamber components, the coating will be consumed and the chamber components will ultimately need to be refurbished. The erosion of the chamber components leads to process drift and defects. For example, after enough material has been removed from the ring, the profile of the processing plasma changes along the edge of substrate, resulting in process drift and in some case, substrate defects. The chamber components are usually replaced prior to being eroded to the point of creating process drift to ensure process conformity and prevent the manufacturing defects from affecting processing yields. Preventative maintenance (PM) techniques dictate the timing for replacing the chamber component. PM requires the manufacturing process equipment to be shutdown, which is expensive. Additionally, non-optimized chamber maintenance due to excessively early PM results in pre-mature replacement of spare parts and loss of production time, as well as too late PM resulting in substrate defects and chamber contamination. Substrate processors must balance the tradeoff of between shutting down the manufacturing process to replace the rings prior to generating defects and significantly reducing the service life of the ring, and lowering manufacturing yields. Determining the proper PM interval is further complicated by the difficulty in determining the amount that the chamber component is affected by erosion.

Thus, there is a need to improve detection of chamber component service life.

SUMMARY

The present invention generally relates method and part wear indicator for identifying an eroded chamber component in an etching or other plasma processing chamber. In one embodiment, a chamber component has a part wear indicator. The chamber component has a body. The body has a top surface and a bottom surface. A part wear indicator material is disposed in the chamber component body. The part wear indicator has a body. The body of the part wear indicator has a transparent first layer. A second layer has a tracer material disposed therein and wherein the first layer is closer to the top surface of the top surface than the second layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In a processing chamber used for semiconductor manufacturing, edge rings are used as part of the process kit surrounding a substrate. The substrate sits on top of a pedestal or an electrostatic chuck, which usually has a step or other feature for locating the edge ring. The edge ring is used to control the process performance on the substrate in the processing chamber and to protect the pedestal and/or electrostatic chuck from etchants utilized during processing. Monitoring degradation or erosion of the edge ring permits the edge ring to be replaced at an optimal time to prevent processing performance drifting out of specification. Contemporary methods of monitoring edge ring erosion are empirically determined. Embodiments disclosed below provide active or in-situ monitoring of the edge ring erosion over time (RF hours) to limit or prevent the process drift from exceeding allowable thresholds. This allows semiconductor manufacturers to implement scheduled preventative maintenance accurately and to optimize the life of the process kits in the chambers without sacrificing performance. Although described as utilized in an exemplary edge ring, the edge ring is representative of any other chamber component, such as liners, other types of ring, gas distribution plate, showerheads, and the like, and a part wear indicator may be installed in the body of any chamber component exactly as described with reference to the edge ring below.

The part wear indicator, when provided in a body of a chamber component, allows determination of timely component replacement by chamber operators, thus enabling optimized performance the chamber unlike the existing part replacement schedules based on predictive preventive maintenance (PM) techniques. Thus, the part wear indicator provides high-value to chamber operator by optimizing chamber maintenance schedules by preventing pre-mature PM and replacement of the chamber component. Additionally, the part wear indicator prevents late PM, thus preventing undesirable increases in substrate defects and poor product yields.

The part wear indicator generally includes a multi-layer film having a layer of tracer material disposed at a pre-defined depth below the surface of the multi-layer film that is exposed to the processing environment. In one embodiment, the layer of tracer material is comprised of a phosphorescent up-converting material (UCM) that is excitable by infra-red (IR) radiation, such as a 980 nm laser, and emits visible light of different colors ranging over the visible spectrum from blue to red depending on the selection of the UCM. By monitoring the visible light emitted from the UCM, an indication that the chamber component is worn and needs to be replaced may be precisely determined. Thus, PM may be optimally performed in response to detection of the emitted light from the UCM thereby preventing premature chamber component change-out and unnecessary processing chamber downtime.

Figure 1:
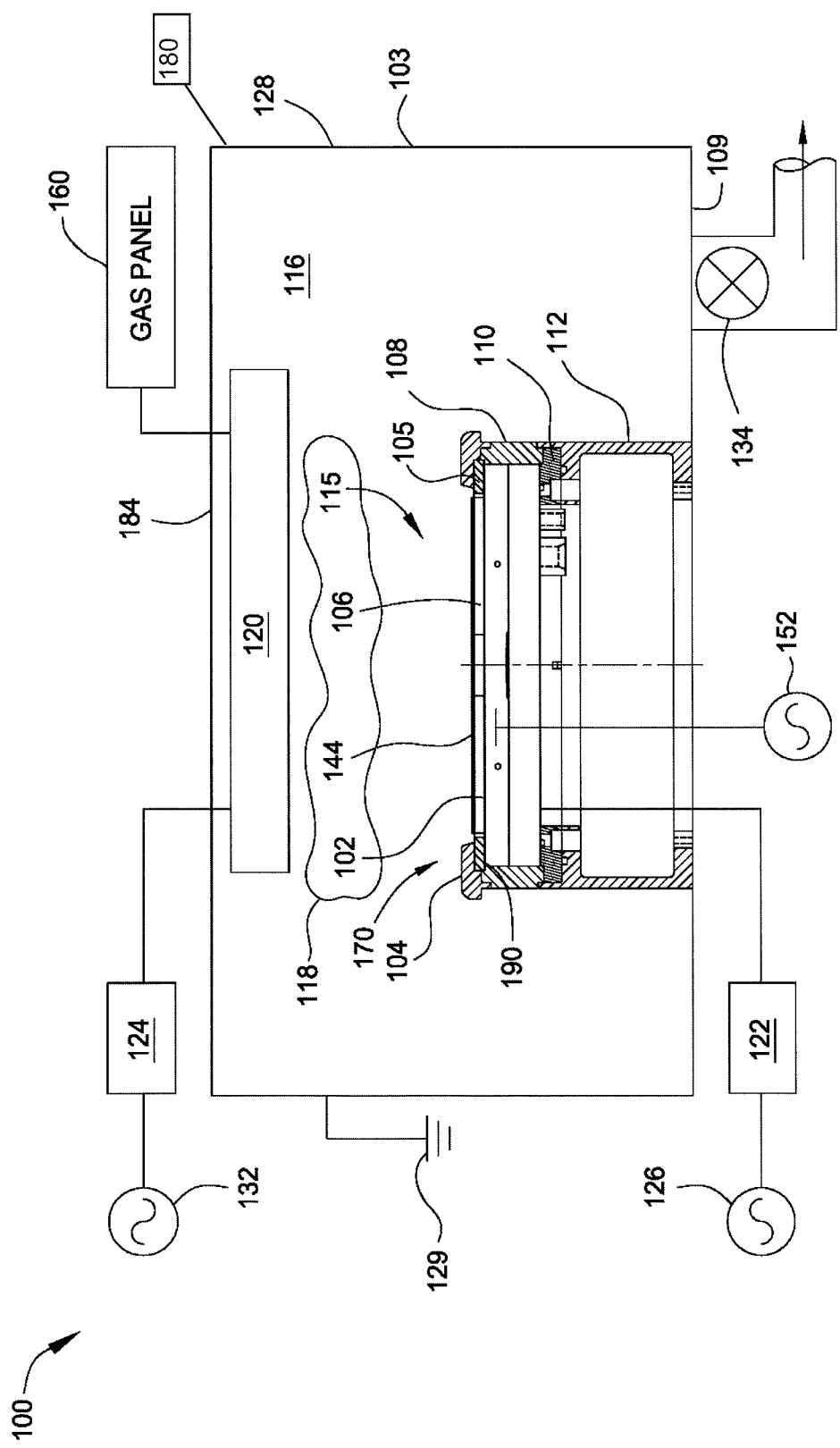
FIG. 1 is a schematic, cross sectional view of a processing chamber having chamber components fitted with a part wear indicator.

FIG. 1 is a schematic, cross sectional view of a processing chamber 100 having chamber components fitted with a part wear indicator. While not discussed here in detail, the part wear indicator may be fitting on chamber components disposed in corrosive environments, such as the environment of an etch chamber. The processing chamber 100 may be utilized alone or, as a processing module of an integrated semiconductor substrate processing system, or cluster tool.

The processing chamber 100 has a chamber body 128 that is coupled to ground 129. The chamber body 128 of the processing chamber 100 has sidewalls 103, a lid 184 and a bottom surface 109. The sidewalls 103, lid 184 and bottom surface 109 define an interior volume 116. The interior volume 116 of the processing chamber 100 is a high vacuum vessel that is coupled through a throttle valve (not shown) to a vacuum pump 134. In operation, a substrate 144 is placed on a substrate support 115 disposed in the interior volume 116, which is pumped down to a near vacuum environment for processing therein.

A showerhead 120 may be disposed proximate the lid 184 and within the interior volume 116. Alternately, the showerhead 120 may be a pas distribution plate (120). One or more gases are introduced from a gas panel 160 via the showerhead 120 into the interior volume 116 of the processing chamber 100. The showerhead 120 may be coupled to an RF power source 132 through a matching network 124. The gas from the showerhead 120 may be ignited into a plasma 118 in the interior volume 116 by applying the power from the RF power source 132 to the showerhead 120. The plasma 118 may create a corrosive environment within the interior volume 116. The plasma 118 may be used to etch a feature in the substrate 144 during processing and then pumped out of the processing chamber 100 through the vacuum pump 134. Chamber components exposed to the plasma 118 in the interior volume may likewise be eroded by the corrosive environment.

The substrate support 115 is disposed below the showerhead 120, which is used to supply various gases into the interior volume 116 of the processing chamber 100. The substrate support 115 generally includes an electrostatic chuck (ESC) 102, a ring assembly 170 having a cover ring 104 and an edge ring 105, a cathode 106 to electrically bias the substrate 144 disposed on the ESC 102, an insulator pipe 108, a pedestal insulator 110, and a pedestal support 112.

The insulator pipe 108 and the pedestal insulator 110 function to electrically isolate the chamber walls and the substrate support 115, respectively, from the electrical bias applied to the ESC 102. The substrate support 115 may be biased by a DC power supply 152. An RF power source 126 may optionally be coupled to the substrate support 115 through a matching network 122.

The cover ring 104 may be a single piece ring that rests on the edge ring 105 and insulator pipe 108. The substrate 144, when placed onto the substrate support 115, rests on the ESC 102 and be surrounded by the edge ring 105 and cover ring 104. Since the edge ring 105 and cover ring 104 also focuses the plasma, the edge ring 105 and cover ring 104 are usually made of silicon or quartz and consumed during processing. In one embodiment, the cover ring 104 is formed from a quartz material. The edge ring 105 has a component body 190 formed from a silicon containing material. In plasma etch chambers, the cover ring 104 and edge ring 105 protects the ESC 102 from erosion by the plasma as well as controlling the distribution of the plasma near the edge of the substrate 144 during processing. To prevent process drift and reduced process yield due to erosion of the cover ring 104, edge ring 105 or other desired chamber component, one or more of the edge ring 105 and/or other chamber component disposed in the processing chamber 100 incorporates a part wear indicator for monitoring the wear of the edge ring 105.

The part wear indicator, when present on a chamber component exposed to the processing environment, enables the state (e.g., life) of the chamber component to be monitored for degradation as illustrated in the representative example described below.

Figure 2C:
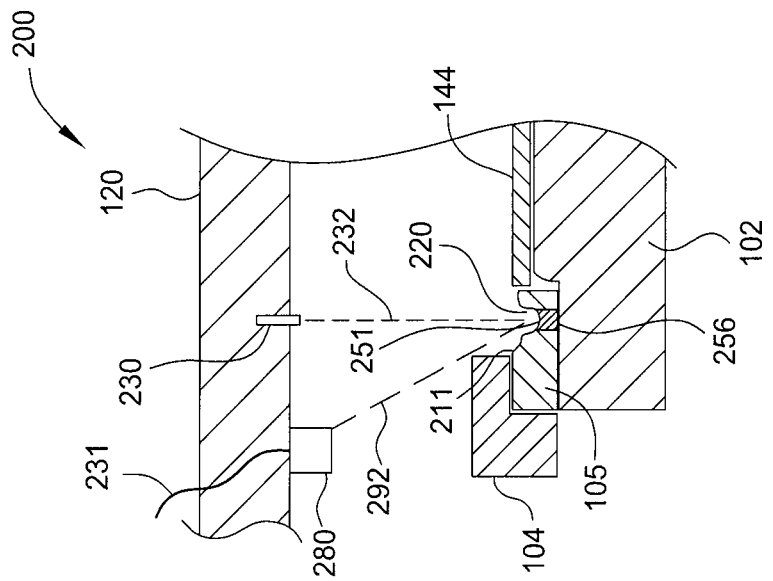
FIGS. 2A-2C are partial plan views of the processing chamber of FIG. 1 illustrating a portion of a ring assembly having the part wear indicator according to an embodiment.
Figure 2B:
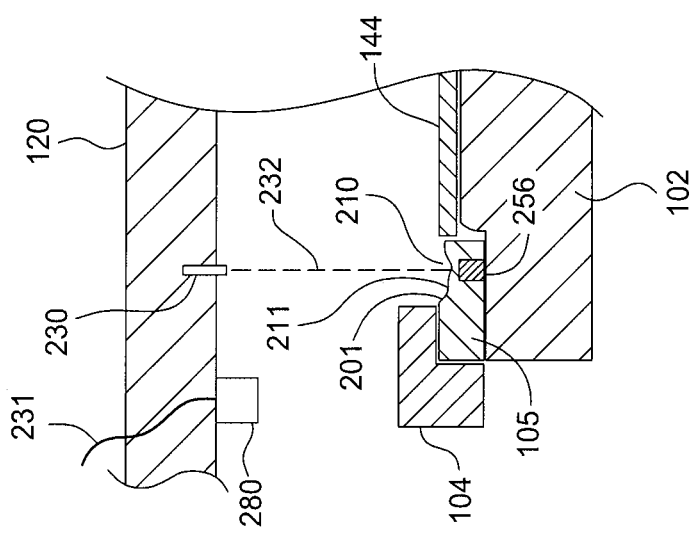
Figure 2A:
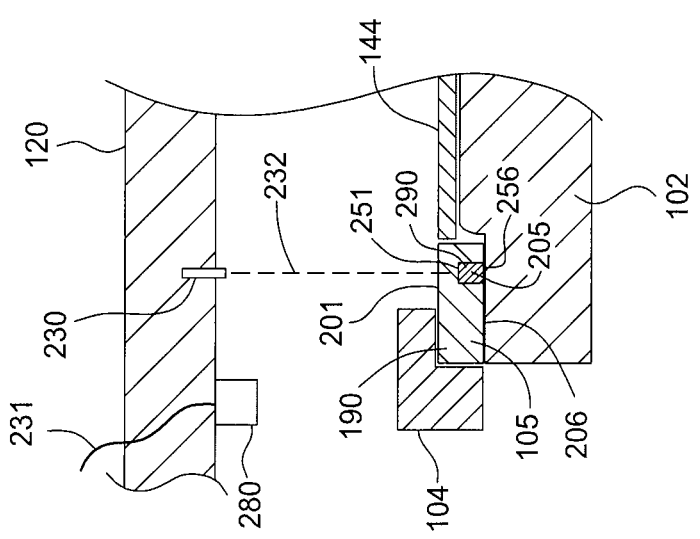
Figure 6:
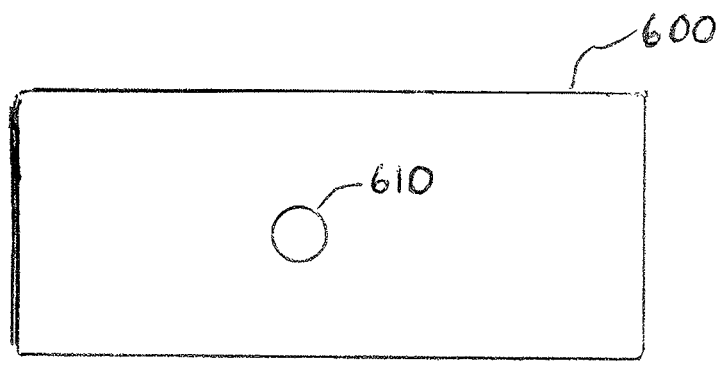
FIG. 6 illustrates a chamber component, such as a showerhead, liner, ESC, etc., having the part wear indicator for determining wear of a chamber component.

FIGS. 2A-2C are partial plan views of the processing chamber 100 of FIG. 1 illustrating a portion of the ring assembly 170 having a part wear indicator 290. It should be appreciated that the discussion of the part wear indicator 290 with respect to the ring assembly is equally pertinent to other chamber components, and the wear indicator 290 may be utilized in the bodies comprising any of other rings, liners, ESCs, gas distribution plates, showerheads, or other chamber component exposed to the internal environment of the processing chamber 100. For example, FIG. 6 illustrates a chamber component 600, such as a showerhead, liner, ESC, etc. . . . , having the part wear indicator 290 for determining wear of the chamber component 600.

Referring first to FIG. 2A, a portion of the showerhead 120 is shown disposed vertically above the ESC 102. The ESC 102 has the cover ring 104 and one embodiment of the edge ring 105 containing the part wear indicator 290 disposed therein.

The component body 190 of the edge ring 105 has a top surface 201 exposed to the plasma environment of the processing chamber 100. The component body 190 of the edge ring 105 has a bottom surface 206. The bottom surface 206 of the edge ring 105 is disposed on the ESC 102.

The part wear indicator 290 is embedded in the component body 190. For example, the part wear indicator 290 may be a pin 205 or plug of material, a layer of material, or other material embedded in the component body 190 suitable for indicating wear, or erosion, to the edge ring 105 by the plasma in the manner described below. The part wear indicator 290 may be formed from at least material that is different than a material comprising the component body 190. The at least one material comprising the part wear indicator 290 is detectable upon exposure to excitation energy. For example, the excitable material of the part wear indicator 290 may emit light different than the component body 190 when excited to identify wear on the chamber component.

In the embodiment of FIGS. 2A through 2C, the part wear indicator 290 will be discussed in reference a pin 205 disposed in the edge ring 105. It should be appreciated that a second part wear indicator, substantially similar to the part wear indicator 290 yet uniquely identifiable, may additionally be disposed in other chamber components such as liners, showerheads, or the cover ring 104, thus allowing individual yet simultaneous monitoring of multiple chamber components which advantageously permits identification of signals for each individual chamber component independently from the other chamber components. The construction/layout of the part wear indicator 290, in the example of the pin 205, will be discussed further below with reference to FIG. 3. The pin 205 has an upper surface 251 disposed nearest, which can optionally be spaced below, the top surface 201 of the edge ring 105. Likewise, the pin 205 has a lower surface 256 disposed nearest the bottom surface 206 of the edge ring 105. The lower surface 256 of the pin 205 may extend to the bottom surface 206 of the edge ring 105 such that the bottom surface 206 of the edge ring 105 is substantially coplanar with the lower surface 256 of the pin 205. Alternately, the lower surface 256 of the pin 205 may be disposed between the top surface 201 and bottom surface 206 of the edge ring 105. In one example, the material of the body 190 may cover the upper surface 251 of the pin 205. In one embodiment, the pin 205 is fully encapsulated by the edge ring 105. In this embodiment, the pin 205 may be formed therein during assembly or fabrication of the edge ring 105. In a second embodiment, the lower surface 256 of the pin 205 is accessible along or through an opening in the bottom surface 206 of the edge ring 105. In other embodiments, the part wear indicator 290 may be an annular layer of material disposed within the component body 190 of the edge ring 105.

The pin 205 has a layer of material different than the material of the component body 190 of the edge ring 105 positioned at a predetermined depth from the top surface 201 of the edge ring 105 that will get exposed and detected as erosion of the over lying portion top surface 201 is removed to expose the pin 205. For example, the pin 205, or part wear indicator 290, may be formed from quartz and have an up-converting material (UCM) layer embedded therein while the edge ring 105 is formed from a silicon containing material such as SiC. Up-conversion is a process in which the sequential absorption of two or more photons leads to the emission of light at a shorter wavelength than the excitation wavelength. An example is the conversion of infrared light to visible light. Materials by which up-conversion can take place often contain ions such as Ln3+, Ti2+, Ni2+, Mo3+, Re4+, Os4+, and so on.

An energy source 230 may be disposed in the interior volume 116 of the processing chamber such as attached to the showerhead 120 above the edge ring 105. A sensor 280 may be positioned in the interior volume 116 of the processing chamber such as attached to the showerhead 120 above the edge ring 105. Alternatively, the energy source 230 and sensor 280 may be positioned outside the chamber 100 in a location that facilitates interaction with the part wear indicator 290 upon its exposure. In one embodiment, the energy source 230 is a laser, such as a 980 nm IR laser, or other suitable source of electromagnetic energy. The energy source 230 may emit electromagnetic radiation which excites up-converting material (UCM) in the part wear indicator 290 to emit light frequencies detectable by the sensor 280. For example, the edge ring 105 may be formed from quartz and have a part wear indicator 290 incorporating a green-light emitting UCM layer. The sensor 280 may be an optical sensor suited for detecting and reporting the presence of light of prescribed frequencies, such as green light, detected in the interior volume 116.

The sensor 280 may be coupled via an optical or electrical transmission line 231 to the controller 180. The sensor 280 may be configured to operate in the absence of plasma, i.e., while processing of the substrate 144 is not occurring. Alternatively, the sensor 280 may be disposed outside of the processing chamber 100 looking through a window at the edge ring 105. In yet other alternatives, the energy source 230 may use a pulse timed with the sensor 280 to substantially eliminate (or filter out) noise from the plasma.

During processing, the edge ring 105 is eroded by the plasma. FIG. 2B illustrates erosion 211 along the top surface 201 of the edge ring 105. The erosion 211 begins to form a trough 210 in the edge ring 105. The energy source 230 may direct energy at the pin 205 while the plasma thins the amount of edge ring 105 material over the pin 205.

In FIG. 2C, the erosion 211 of the top surface 201 has progressed to a point where the trough 210 is now an opening 220 sufficiently exposing the upper surface 251 of the pin 205. As the upper surface 251 of the pin 205 begins to become exposed, the energy from the energy source 230 may penetrate the transparent host material and interact with the up-converting material to emit light detectable by the sensor 280 within the frequency bands indicative of wear or erosion of the edge ring 105.

Figure 3:
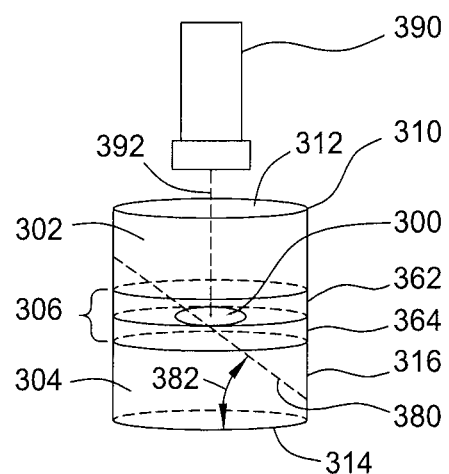
FIG. 3 illustrates a side plan view of the part wear indicator.

FIG. 3 illustrates a side plan view of the part wear indicator 290, according to an embodiment of the invention. The part wear indicator 290 may have an indicator body 310. The indicator body 310 may have a top surface 312 and a bottom surface 314. The indicator body 310 may additionally be formed from one or more layers of material. For example, the indicator body 310 of the part wear indicator 290 may have a first layer 302 adjacent the top surface 312. A second layer 306 may be disposed under the first layer 302 opposite the top surface 312. The second layer 306 may contain a tracer material 300 embedded therein. The second layer 306 may be formed from a first sheet 362 and second sheet 364. Alternately, the second layer 306 may formed from a single material with the tracer material 300 deposited therein during fabrication. The tracer material 300 may be mixed in an epoxy, printed or deposited in any suitable manner. In some embodiments, the bottom surface 314 is part of the second layer 306 and positioned on the opposing side of the first layer 302. Optionally, the indicator body 310 may have a third layer 304 of material. The second layer 306 is disposed on the third layer 304. In embodiments wherein the indicator body 310 has a third layer 304, the bottom surface 314 is part of the third layer 304 and positioned on the opposing side of the second layer 306.

The indicator body 310 may optionally contain a lens 380 therein. The lens 380 may be configured to focus or redirect energy 392 from an energy source 390. The lens 380 may be oriented at an angle 382 for redirecting the energy 392 to the tracer material 300. Alternately, or additionally, the lens 380 may direct the energy up converted by the tracer material 300 toward the sensor in the processing chamber. The lens 380 may be formed by polishing or printing or separately placed in the indicator body 310 during manufacturing. The lens 380 beneficially redirects the energy from the part wear indicators 290 to the sensor thus allowing the sensor to readily detect the energy 392. Thus, the number of sensors can be minimized by having the lens 380 direct the energy 392 from multiple part wear indicators 290 to a location visible to the sensor.

To avoid generation of contamination, particles and defects by exposing particles from tracer material 300 directly to the interior volume 116 of the processing chamber 100, the chamber component having the part wear indicator 290 disposed therein, or the first layer 302 of the indicator body 310 of the parts wear indicator 290, may be formed from a transparent material such as quartz ($SiO_2$), sapphire, diamond, zirconia, aluminum oxynitride or other material suitably transparent to the excitation energy directed at the tracer material 300. The tracer material 300 is excitable by electromagnetic energy and radiates energy at a particular frequency dependent on the composition of the tracer material 300. In one embodiment, the tracer material 300 may be an up converting material (UCM) that is excited by infra-red (IR) radiation and emit light in frequencies corresponding to the selected UCM. The tracer material 300 may be formed from one or more of the following UCMs: $NaY_{1.54}Yb_{0.40}Er_{0.06}F_5O$ (red emission), $NaY_{0.77}Yb_{0.20}Er_{0.03}F_4$ (green emission), $NaY_{0.77}Yb_{0.20}Tm_{0.03}F_4$ (blue emission). However, it should be appreciated that other nanoparticles may be used as UCM such as Lanthanide-doped nanoparticles, CdSe, PbS and PbSe. In yet other alternatives, the tracer materials 300 may be a phosphor or other suitable material.

These tracer materials 300, when using an UCM, are deliverable as white (at normal indoor illumination) powders of about 5 μm particle size. The red, green and blue emitting UCMs have quantum efficiencies of about 0.05%, about 10% and about 0.1%, respectively. Even though the quantum efficiencies are low for red and blue emitting UCMs, only small quantities of tracer material 300 on the order of 10 mg are required for a signal detectable by the sensor when excited by the energy source.

UCM microscopy slide samples were prepared as a stack of/glass/UCM (tracer material 300) mixed with epoxy. The emitted light from exciting the tracer material 300 was easily recorded using a camera. In a first sample, 200 mg of UCM powder was mixed with a small amount of epoxy and applied over a glass slide. In a second sample, 20 mg of UCM powder was mixed with a small amount of epoxy and applied over a glass slide. A control slide was prepared with small amount of epoxy. The second sample was fairly transparent yet still effective in up-converting a 980 nm IR laser emission to a wavelength specified by the UCM. The results suggested that only small area patches on the order of a few $mm^2$ are required for the tracer material 300 in the part wear indicator 290 to be detectable. Thus, the part wear indicator 290 can be realized by a thin film or the small plug, such as the indicator body 310 having of a bottom plate (the third layer 304) and a top plate (the first layer 302) with a thin film of UCM mixed with epoxy to form the tracer material 300 embedded in the second layer 306. These epoxy adhesives are both high temperature and ultra-high vacuum compatible and are suitable for forming the tracer material 300. The tests demonstrate that the part wear indicator 290 having the tracer material 300 is suitable for use in a plasma processing environment for showing wear of chamber components. Since most processes already involve Si and O, many chamber components, including those fabricated from materials other than quartz, can beneficially incorporate a part wear indicator 290 in their bodies.

Figure 4:
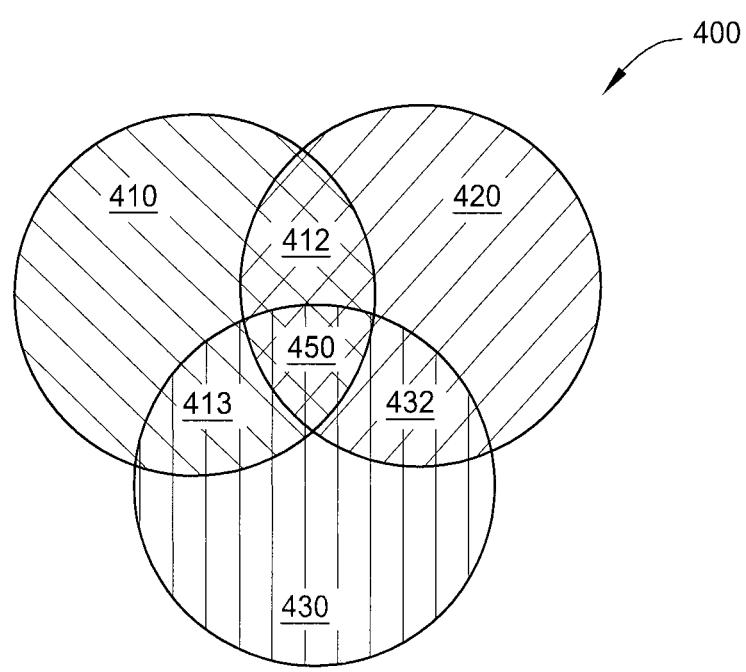
FIG. 4 illustrates a color chart for uniquely identifying part wear indicators with phosphorescent up-converting materials (UCM) having various color mixing scheme.

UCM powders of different colors can be mixed according to the standard color mixing scheme. FIG. 4 illustrates a color chart for uniquely identifying part wear indicators with UCMs having various color mixing scheme 400. The color mixing scheme 400 may be with an RGB (red, green, blue) color mixing scheme or CMY (cyan, magenta, yellow) color mixing scheme. The projection of a first emission 430 (red or magenta), second emission 410 (blue or cyan) and third emission 420 (green or yellow) material shows secondary colors 412, 413, 432 where two of the first emission 430, second emission 410 or third emission 420 overlap. The combination of all three of the first, second and third emissions 410, 420 430 provide yet a third emission spectrum 450 of color. It should be appreciated that first, second and third emissions 410, 420 430 color space may also be substituted with other color spaces for generating a predictable emission. In one embodiment, the first, second and third emissions 410, 420 430 use the RGB color space. The RGB color space may be used to generate all kinds of colors, e.g., red+green=yellow, green+blue=cyan and blue+red=magenta. Mixing enables innovative color coding and allows for unique chamber component authentication. For example, a first chamber component may have a part wear indicator 290 comprising a UCM does not share the same composition as a UCM utilized in a part wear indicator 290 disposed in a body of a second chamber component. Thus various consumable chamber components exposed to the plasma environment may have part wear indicators assigned with unique color coding by mixing different UCMs to identify specific chamber components requiring preventative maintenance simultaneously, and in some embodiments, using a common energy source 230 and sensor 280.

Figure 5:
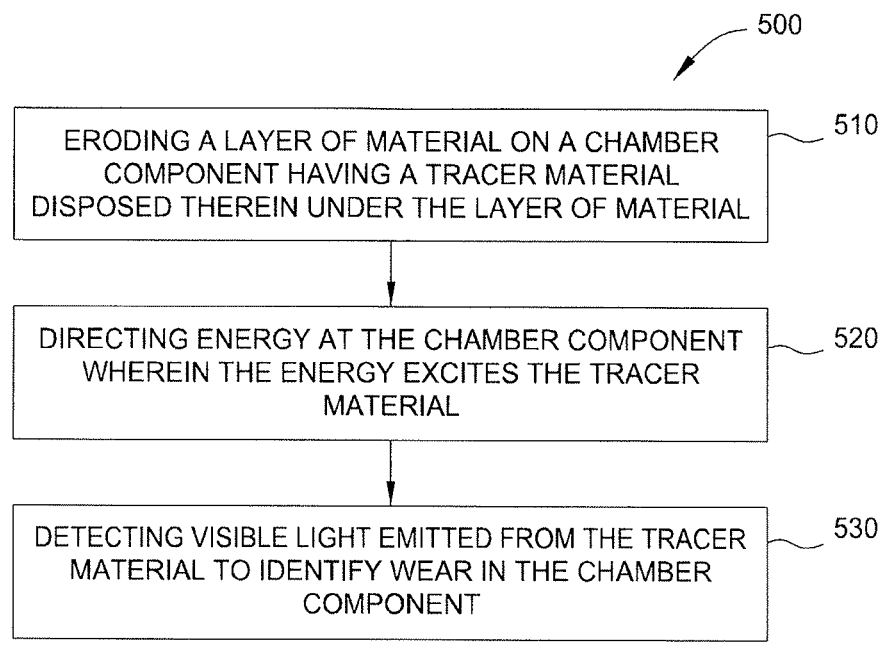
FIG. 5 illustrates a method for determining wear of a chamber component.

FIG. 5 illustrates a method 500 for detecting wear on a chamber component. The method 500 begins at step 510 wherein material is eroded from an exposed surface of a chamber component sufficiently to allow a tracer material disposed in the chamber component to interact with an energy source. The method 500 continues at step 520 wherein energy, from the energy source, excites the tracer material. The method 500 continues at step 530 wherein visible light emitted from the excited tracer material is detected by a sensor. The emitted light indicative of the wear of the chamber component. The method 500 continues at step 540 by issuing a wear indication message. The wear indication message may be a text message, email message, computer warning message, audio message (such as a sound signal), visual message (such as switching on a light signal) or other electronic message or indicator.

The embodiments disclosed above advantageously provide an apparatus and method for providing identification of worn chamber components and notice for preventative maintenance for said chamber components prior to experiencing undesired process drift which may result in substrate defects. The embodiments ensure maximum use of the chamber component prior to replacement, thus reducing expensive and unwarranted replacements.

While the foregoing is directed to embodiments of the present invention, other and further embodiments of the invention may be devised without departing from the basic scope thereof, and the scope thereof is determined by the claims that follow.

What is claimed is:

1. A plasma processing chamber comprising:
a chamber body having in internal volume;
a substrate support disposed in the internal volume;

an energy source configured to emit light of a first wavelength;

a first chamber component disposed in the internal volume of the chamber body, the first chamber component comprising:

a component body having a top surface and a bottom surface; and a part wear indicator having an indicator body disposed in the component body, the indicator body comprising:

a transparent first layer; and a second layer comprising a tracer material, wherein the first layer is closer to the top surface than the second layer, wherein the tracer material is an up-converting material (UCM) configured to emit light of a second wavelength when excited by the light of the first wavelength, the second wavelength being shorter than the first wavelength;

a sensor configured to detect the light of the second wavelength from the first chamber component;

a controller coupled to the sensor and configured to issue a wear indication message upon detection of the light of the second wavelength by the sensor.

2. The plasma processing chamber of claim 1 further comprising:

a second chamber component having a second part wear indicator.

3. The plasma processing chamber of claim 2, wherein the tracer material disposed in the first chamber component radiates energy at a different frequency than a tracer material disposed in the second chamber component.

4. The plasma processing chamber of claim 1, wherein the UCM is one or more materials selected from the group consisting of $NaY_{1.54}Yb_{0.40}Er_{0.06}F_5O$, $NaY_{0.77}Yb_{0.20}Er_{0.03}F_4$, and $NaY_{0.77}Yb_{0.20}Tm_{0.03}F_4$.

5. The plasma processing chamber of claim 1, wherein the first chamber component is a ring, a showerhead, an ESC or a gas distribution plate.

6. The plasma processing chamber of claim 1, wherein the energy source is a laser.

7. The plasma processing chamber of claim 1, further comprising:

a second chamber component having a second part wear indicators assigned with unique color coding by mixing different UCMs to identify the second chamber component from the component body.

* * * * *